United States Patent [19]
Caudel

[11] 4,137,499
[45] Jan. 30, 1979

[54] SIGNAL STRENGTH MEASURING TRANSCEIVER

[75] Inventor: Edward R. Caudel, Dallas, Tex.

[73] Assignee: Texas Instruments Incorporated, Dallas, Tex.

[21] Appl. No.: 791,265

[22] Filed: Apr. 27, 1977

[51] Int. Cl.² .................. H04B 17/00; H04B 1/40
[52] U.S. Cl. ............................ 325/67; 325/25
[58] Field of Search ............ 325/15, 17, 20, 21, 325/67, 25

[56] References Cited
U.S. PATENT DOCUMENTS

| | | | |
|---|---|---|---|
| 3,588,701 | 6/1971 | Kahn | 325/15 |
| 3,641,434 | 2/1972 | Yates | 325/25 |
| 3,835,384 | 9/1974 | Liff | 325/25 |
| 3,983,484 | 9/1976 | Hodama | 325/25 |
| 4,027,242 | 5/1977 | Yamanaka | 325/25 |
| 4,041,395 | 8/1977 | Hill | 325/67 |

Primary Examiner—Robert L. Richardson
Assistant Examiner—Michael A. Masinick
Attorney, Agent, or Firm—Stephen S. Sadacca; Rene Grossman

[57] ABSTRACT

A transceiver includes an antenna having an input for transmitting electrical signals applied thereto. Signal generating means are provided for generating electrical reference signals of a fixed frequency. Transmission means selectively couple the reference signals to the antenna input in response to logic signals. Sensing means digitally indicate the forward voltage waveforms and reverse voltage waveforms on the antenna when the reference signals are applied thereto. A processor is coupled to selectively generate the logic signals and to receive the digital signals indicating the magnitude of the forward voltage and reverse voltage for making signal strength calculations thereon.

13 Claims, 18 Drawing Figures

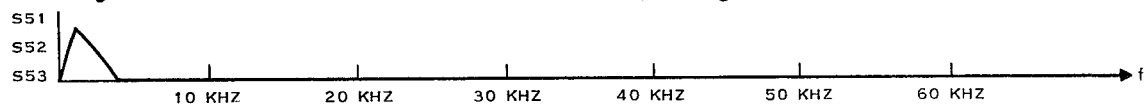
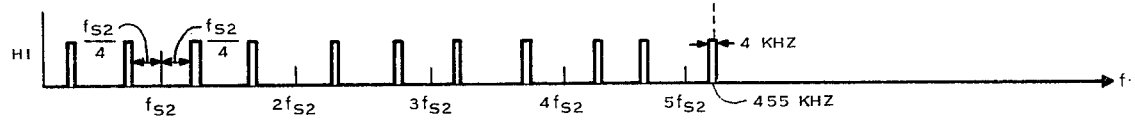
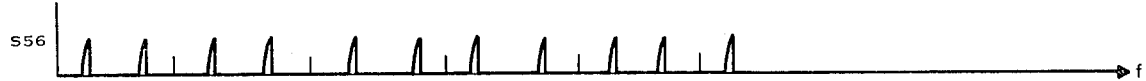
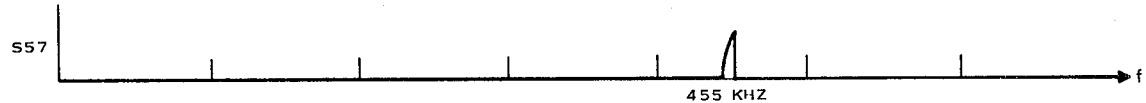
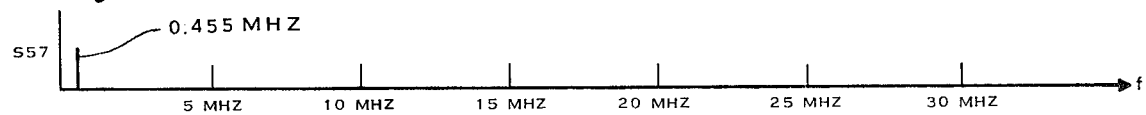
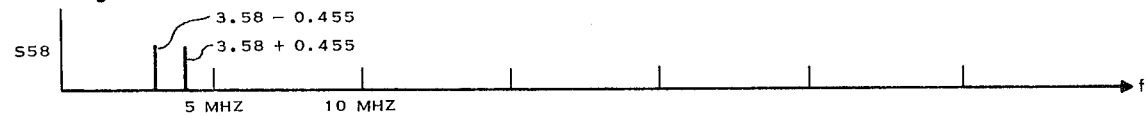
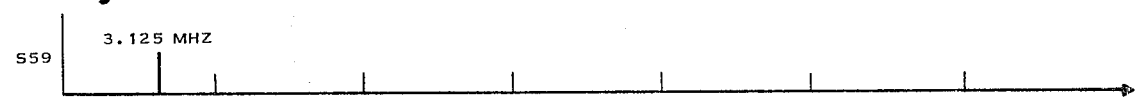
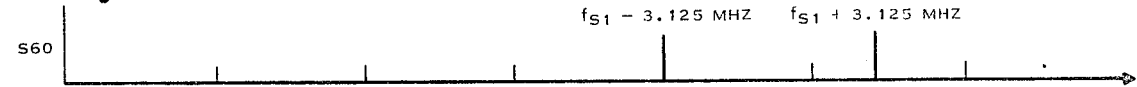

SWITCH 5200

SWR 6100

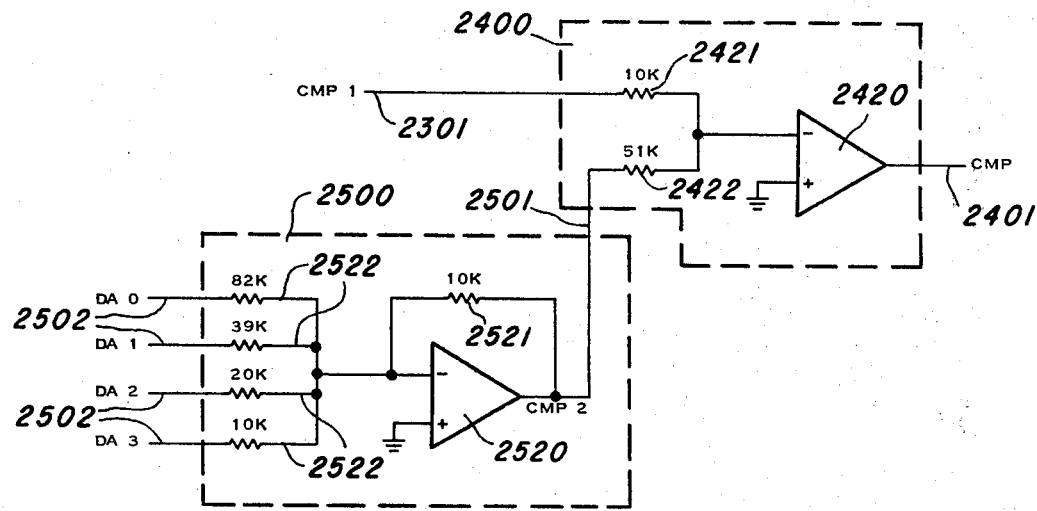

SIGNAL STRENGTH MEASURING TRANSCEIVER

BACKGROUND OF THE INVENTION

This invention relates to analog signal processing, and more particularly to transceivers having signal strength measuring means.

This invention further relates to the transceiver and components thereof described and claimed in the following U.S. Patent Applications filed of even date with and assigned to the assignee of the present invention: U.S. Ser. No. 791,611 entitled "A Digitally Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,254 entitled "A Computer Controlled Radio System" by Michael J. Cochran and Edward R. Caudel; U.S Ser. No. 791,450 entitled "A Transceiver With Only One Reference Frequency" by Michael J. Cochran; U.S. Ser. No. 791,614 entitled "A Charge Transfer Device Radio System" by Michael J. Cochran; U.S. Ser. No. 791,253 entitled "A Transceiver Capable of Sensing A Clear Channel" by Jerry D. Merryman, Michael J. Cochran and Edward R. Caudel; U.S. Ser. No. 791,256 entitled "A Highly Selective Programmable Filter Module" by Michael J. Cochran and Edward R. Caudel; U.S. Ser. No. 791,616 entitled "A Duel Processor Transceiver" by Edward R. Caudel, William R. Wilson and Thomas E. Merrow; U.S. Ser. No. 791,264 entitled "An Electronic Phase Detector Circuit" by Michael J. Cochran.

A transceiver has a transmit mode of operation and a receive mode. In a receive mode, the transceiver receives radiated electronic input signals comprised of a plurality of non-overlapping frequency bands, filters one of the bands from the plurality, frequency shifts the one band from radio frequencies to a lower frequency, and converts the filtered band to audible sounds. The input signals may be amplitude modulated (AM) or single sideband (SSB) signals, as an example. Antenna means receive the radiated input signals. Filtering devices are included in the transceiver to select one of the bands from the plurality. Mixing devices are included to frequency shift the selected band, and a demodulator device is included to demodulate the selected band. Similarly, in a transmit mode, a transceiver modulates electrical signals having audio frequencies, frequency shifts the modulated signals to radio frequencies of a selectable channel, and radiates the radio frequencies via an antenna.

When operating in the transmit mode, it is desirable that the operator receive some indication of whether his speech is being transmitted as intended; or whether a malfunction condition exists. To this end, transceivers have included devices for measuring the standing wave radio (SWR) on the transmitting antenna. The standing wave ratio is a measure of voltages on the antenna due to forward traveling waves in comparison to voltages due to reverse traveling waves. In general, the magnitude of the forward traveling wave is several orders of magnitude greater than the magnitude of the reverse traveling wave under normal operating conditions. Conversely, under abnormal conditions, the magnitude of the reverse traveling wave is equal to or greater than the magnitude of the forward traveling wave. Such an abnormal condition may be due to a physical damaged antenna, or an impedance mismatch between the output power amplifier and the antenna due to corrosion, as an example.

In the past, SWR measuring devices were manually activated. This is, the operator was required to depress one or more keys to enable the SWR measuring function. Also in the past, SWR measuring devices were comprised exclusively of analog circuitry. As a result, the operator was given an analog indication of the SWR; and the accuracy of the reading was limited by the accuracy of an electro-mechanical analog meter. Additionally, the operator was required to manually calibrate the meter. For example, the operator would first manually activate several keys such that the forward traveling wave gave a full-scale deflection. Reverse traveling waves were subsequently indicated relative to the full-scale deflection.

By comparison, the present invention includes an SWR measuring device which is automatically activated. Additionally, the disclosed invention is implemented almost entirely with digital circuitry. Further, the invention gives a digital readout of the SWR. Also, the operator is not required to manually calibrate the invention.

Accordingly, it is one objective of the invention to provide an improved radio transmitter.

Another object of the invention is to provide a radio transmitter having an SWR measuring device which is automatically activated.

Another object of the invention is to provide a transmitting radio system having a digital SWR display.

Still another object of the invention is to provide a transmitting radio system having an SWR measuring device which requires no manual calibration.

SUMMARY OF THE INVENTION

These and other objectives are accomplished in accordance with the invention by a transceiver which includes an antenna having an input for transmitting electrical signals applied thereto. The transceiver further includes signal generating means for generating electrical reference signals of a fixed frequency. Transmission means selectively couple the reference signals to the antenna input in response to microcommands. Forward voltage waveforms and reverse voltage waveforms are generated on the antenna when the signal generating means is coupled thereto. Standing wave sensing means are coupled to the antenna for generating first and second digital signals indicating the magnitude of the forward voltage waveforms and the reverse voltage waveforms, respectively. A microprocessor has outputs coupled to the tranmission means for generating the microcommands, and has inputs coupled to receive the digital signal for making signal strength calculations thereon. Prior to each voice transmission, the microprocessor couples the signal generating means to the antenna for a short time interval, makes signal strength calculations on the digital signals, and indicates any abnormal condition to the operator via a digital display.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings; wherein:

FIG. 3 is comprised of graphs 3A–3K representing a series of frequency diagrams illustrating signals at various points on the transmit signal path of FIG. 2.

FIGS. 4A–4D are detailed circuit diagrams of the standing wave ratio measuring circuit embodied in the present invention.

DETAILED DESCRIPTION OF SPECIFIC EMBODIMENTS

Figure 1:
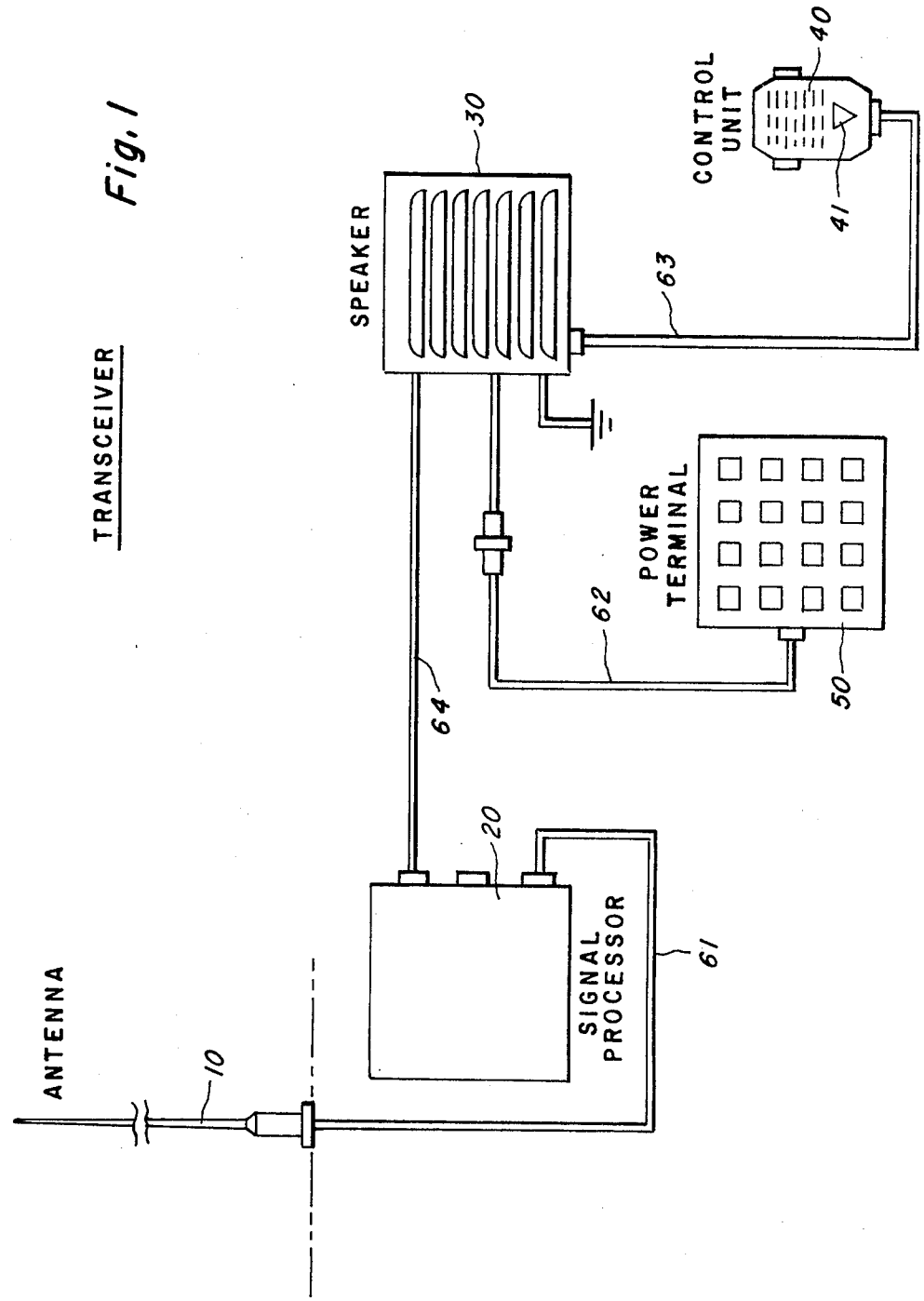
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61–64 as illustrated in FIG. 1. The length of cables 61–64 are chosen to suit the particular environment in which the transceiver operates. For example, if the operating environment is an automobile, the length of cables 61–64 are chosen to permit operator access to speaker 30 and control unit 40, battery power connection to power terminal 50, operable mounting of antenna 10, and theft secure packaging of signal processor 20.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

A microprocessor 3500 is utilized to provide data and clocking input signals over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Figure 2:
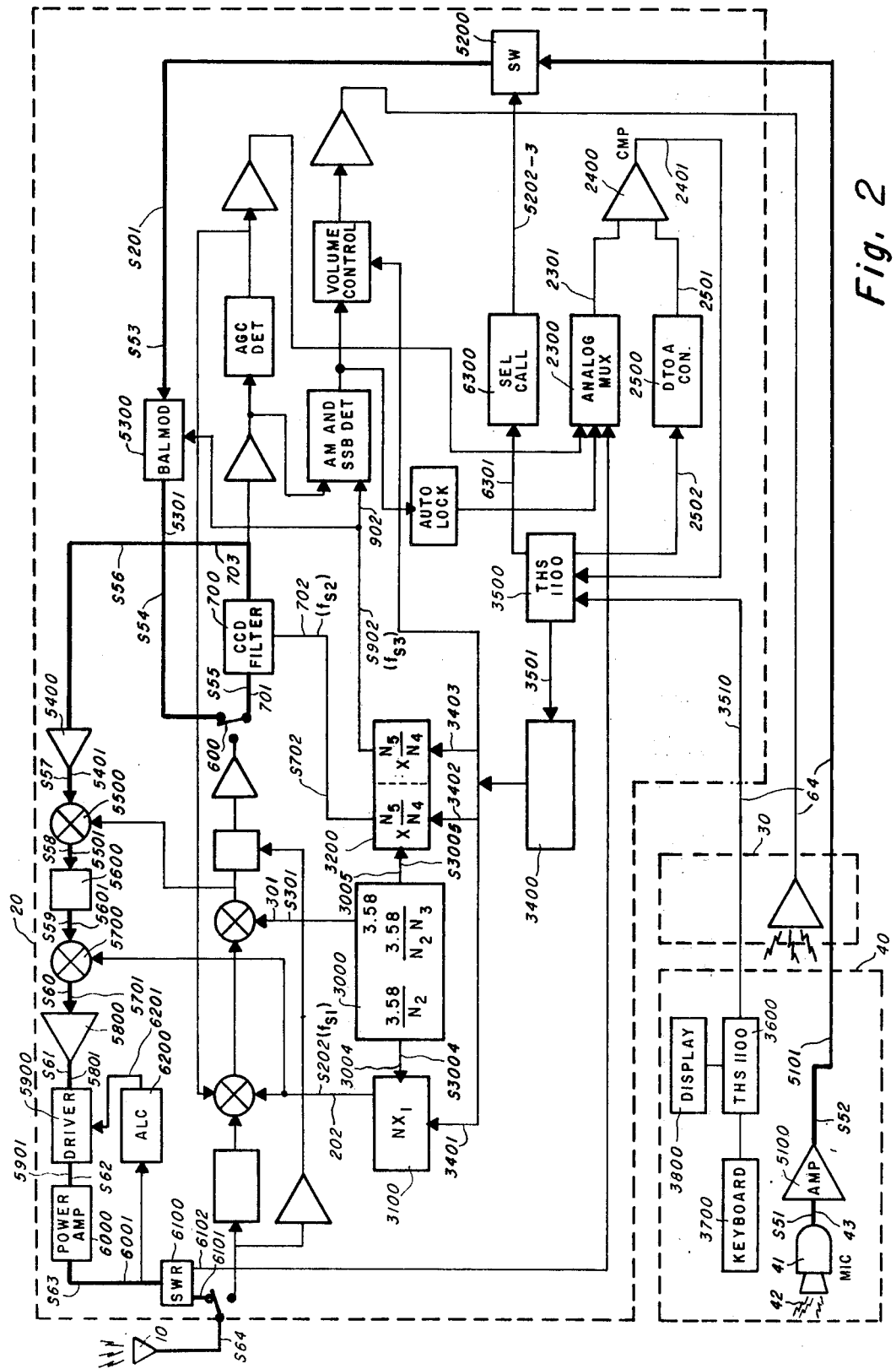
FIG. 2 is a circuit diagram of the transceiver of FIG. 1 wherein the transmit signal path components are emphasized.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000–3200 may be implemented with circuits other than those illustrated in FIGS. 5–8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to ¼. For example, k could equal ⅛, in which case the values of N1–N6 would be scaled appropriately.

Referring now to FIG. 10 a block diagram of that portion of the TMS1100 which was not included in FIG. 9 is therein illustrated. Input register bit K4 is coupled to receive a logic signal 250Hz, and input register bit K8 is coupled to receive a logic signal CMP. Further, output bits R5–R10 are the source of logic signals MUX1, MUX2, MUX3, RCV, STANDBY and AUTOLEN, respectively. These signals are microcommands to the circuits which receive them. Signal RCV is utilized to control switch 600 as was illustrated in FIG. 4f. In addition, the TMS100 has a second output register having output bits 00, 01, 02, and 03 which generate logic signals (microcommands), DA0, DA1, DA2, and DA3, respectively. The function of each of the above microcommands is described below.

The transceiver of FIG. 2 includes means for performing a squelch operation. The squelch operation functions during a receive mode to inhibit signals S9 from passing through volume control unit 1000 whenever signal S9 contains no information. The presence or absence of information in signal S9 is indicated by the amplitude of the signal. When the amplitude of signal S9 is relatively small, volume control unit 1000 is disabled by setting signal B4 on lead 3404 to a high voltage. Conversely, volume control unit 1000 is enabled by setting signal B4 to a low voltage when signal S9 has a relatively high amplitude.

Referring back to FIG. 2, the circuit components which are utilized to implement the squelch function are therein illustrated. These components include an AGC detector 2100 having an input coupled to lead 801 for receiving signal S9. In response to signal S9, AGC detector 2100 generates an analog signal AGC on a lead 2101. Signal AGC has an amplitude proportional to the time average amplitude of signal S9. Lead 2101 couples to the input of a scaling circuit 2200. An output of scaling circuit 2200 is coupled via a lead 2201 to an analog multiplexer 2300. Multiplexer 2300 has an output coupled to a lead 2301, and analog signals CMP1 are generated thereon. Lead 2301 couples to the input of an analog comparator 2400. Comparator 2400 has an output coupled via a lead 2401 to the K8 input of TMS1100 microprocessor 3500. Comparator 2400 has a second input which is coupled to the output of a digital-to-analog converter 2500 via a lead 2501. Converter 2500 generates analog signals CMP2 on lead 2501. The TMS 1100 microprocessor generated signals DA0-DA4 are coupled via leads 2502 to inputs of converter 2500.

FIGS. 11A-11D are detailed circuit diagrams of components 2100-2500, and FIG. 11E is a timing diagram illustrating their operation. Referring first to FIG. 11A, a detailed circuit diagram of AGC detector 2100 is therein illustrated. Basically, AGC detector 2100 is comprised of an operational amplifier 2120 having an input circuit 2121 and a feedback circuit 2123. Input circuit 2121 includes a diode 2122 having an input coupled to lead 801 for receiving signal S9. Diode 2122 operates to rectify signal S9, and feedback network 2123 operates to form the time average of the rectified signal. Amplifier 2120 has an output coupled to lead 2101; and signal AGC, which represents the time average of the rectified S9 signal, is generated thereon. FIG. 11E illustrates an example of signals S9 and SGC.

A detailed circuit diagram of AGC scaling circuit 2200 is illustrated in FIG. 11B. The circuit is comprised of an operational amplifier 2220 having an input resistor 2221 and a feedback resistor 2222. Resistors 2221 and 222 provide a scaling factor of one fifth. Signal AGC is coupled through resistor 2221 to a negative input of amplifier 2220. Lead 2201 couples to the output of amplifier 2220.

FIG. 11C is a detailed circuit diagram of analog multiplexer 2300. Multiplexer 2300 is comprised of two, logically controlled switches, 2320 and 2321. Logic signals MUX1, MUX2, MUX3, and AUTOLEN, which are generated by a microprocessor 3500 on leads 3520, are utilized to logically control switches 2320 and 2321. FIG. 11c includes a truth table which lists the input signal that is passed by multiplexer 2300 as a function of the logical control signals. Each of the input signals therein listed is described in the following portions of this description. An output signal CMP1 of multiplexer 2300 is generated on lead 2301.

FIG. 11d is a detailed circuit diagram of comparator 2400 and digital-to-analog converter 2500. Comparator 2400 includes an operational amplifier 2420. Amplifier 2420 has an input coupled to receive signal CMP1 through a 10-K resistor 2421, and the same input is coupled to receive signal CMP2 through a 51-K resistor 2422. Amplifier 2420 has a second input coupled to ground, and has no feedback circuitry. Therefore, its output, which couples to lead 2401, switches between a high and low voltage level dependent upon whether or not signal CMP1 is greater or less than signal CMP2.

Digital-to-analog converter 2500 is comprised of an operational amplifier 2520 having a resistive feedback network 2521 and a resistive input network 2522. Therefore, amplifier 2520 acts as a summer. Signals DA0-DA3 are selectively coupled to the input of resistors 2522 via leads 2502 to thereby provide a digitally-controllable input to the summer. Microprocessor 3500 operates to set the logical states of DA0-DA3 in response to signals L1 and L2 received from control unit 40. These signals are initiated by manual operation of the control unit.

The operation of the above-described squelch apparatus is illustrated in FIG. 11E. During a first time interval, T1, signal S9 has a relatively low average amplitude. That is, signal SAGC is less than signal CMP2. As a result, signal CMP is at a low voltage level. Microprocessor 3500 samples signal CMP at intermittent intervals during the receive mode of operation, and disables volume control unit 1000 in response to signal CMP being at a low voltage level. During a second time interval, T2, the amplitude of signal S9 greatly increases indicating the presence of speech or other information therein. In response, signal SAGC increases to a level greater than the magnitude of signal CMP2, which results in signal CMP switching to a high voltage level. Microprocessor 3500 intermittently samples signal CMP, and in response to its high voltage level, enables volume control unit 1000 to permit the information present in a signal S9 to be converted into audible sounds.

The squelch circuitry is also used by the transceiver to perform a clear channel function and a busy channel function. Both functions are manually activated via control lead 40 as is described infra. Microprocessor 3500 receives signals via leads 3510 indicating the operations to be performed. In response thereto, processor 3500 stores the channel it is presently operating on in its memory. Then it sequentially steps through adjacent channels by varying frequencies $f_{s1}$ and $f_{s2}$. Processor 3500 monitors signal CMP for each channel stepped through and sends messages to processor 3600 indicating its state. When a clear channel or busy channel is found as the function requests, processor 3600 indicates that channel to the operator via display 3800. Then processor 3500 reselects the previously used channel.

The transceiver of FIG. 2 also includes means for performing an autolock function while receiving single sideband signals in the receive mode. The autolock function is implemented by means of autolock unit 2600. Unit 2600 has an input coupled to lead 901 for receiving signal S10 thereon, and has an output coupled via leads 2601 to an input of analog multiplexer 2300. Microprocessor 3500 receives the signals which are generated by the autolock unit on leads 2601 via multiplexer 2300 and comparator 2400. In response thereto, microprocessor 3500 calculates a value for the second selectable frequency $f_{s2}$ which will align signal S9 in the frequency domain with a fixed reference frequency. Microprocessor 3500 then generates micro-command signals on leads 3501 indicating values for N4-N6 which will generate the calculated frequency.

The detailed operation of the autolock function is best understood by referring to FIG. 12. FIG. 12A is a logic diagram of the autolock unit 2600, and FIG. 12B is a timing diagram of its operation. The single sideband signals on which autolock unit 2600 operates include an intermittently present carrier frequency. In one embodiment, this carrier is present for a short period of time just prior to the transmission of speech signals. Autolock unit 2600 operates to measure the actual frequency of the intermittently present carrier. Microprocessor 3500 receives signals on leads 2601 indicating the carrier frequency, and in response thereto, calculates an appropriate $f_{s2}$ frequency by comparing the actual frequency of the intermittently present carrier with an expected or nominal carrier frequency.

As illustrated in FIG. 12A, autolock unit 2600 includes an operational amplifier 2620 having an input coupled to lead 901 for receiving signal S10 thereon. A resistive feedback network 2621 is coupled to amplifier 2620 in a manner which makes amplifier 2620 operation as a zero detector. Amplifier 2620 has an output coupled to a lead 2602, and signal ZERODET is generated thereon. FIG. 11b includes the timing diagram on signals S10 and ZERODET. Lead 2602 couples to the clock input of a D-flip flop 2622. Flip flip 2622 has a Q output which couples via a lead 2624 to the clocking inputs of two other D-flip flops 2623. The signal AUTOLEN, which is generated by microprocessor 3500, enables flip flops 2622 and 2623 when it is true.

Flip flops 2623 are intercoupled to generate signals RUN and ALVALID on leads 2625 and 2626, respectively only when signal AUTOLEN is true. Signal RUN is coupled via a lead 2625 to two, four-bit counters 2630. Counters 2630 are enabled to count whenever signal RUN is true, and are cleared when signal RUN is false. Counters 2630 may be implemented by a 74LS163 as an example. A clock input of counter 2630 is coupled to receive a signal S2631 having a fixed frequency of approximately 100KHz. Signal S2631 is generated by a divide by 9 counter 2631, having a clocking input coupled to receive signal S3002.

Autolock unit 2600 also includes an 8 bit shift register 2640 having parallel inputs coupled via leads 2641 to outputs of counter 2630. A control unit 2642 of register 2640 is coupled to receive logic signal ALVALID via lead 2626. Data is transferred from counters 2630 via leads 2641 into register 2640 when signal ALVALID makes a low voltage to high voltage transition. This transition occurs after counters 2630 have been enabled for two cycles of signal ZERODET.

As is illustrated in FIG. 11C, signal ALVALID also couples to analog multiplexer 2300 where it is sensed by microprocessor 3500. Further, register 2640 has a clocking input which is coupled to receive logic signal CR1CK via lead 2643, and has a data output which is coupled to multiplexer 2300 via lead 2644. Thus, microprocessor 3500 is capable of reading register 2640 under program control.

In one embodiment, the intermittently transmitted carrier has a frequency of 1600 Hz. By comparison, counters 2630 are clocked at a frequency of approximately 100 kHz. Since the difference in the two frequencies is large, the contents of register 2640 will reflect the actual frequency present in signal S9 to a high degree of accuracy.

The operation of the transceiver of FIG. 1, while it is in the transmit mode, will now be described in conjunction with FIGS. 2 and 13. FIG. 2 contains only reference numerals identifying those components of the transceiver which are utilized in a transmit mode. The transmit signal path is emphasized by a thickened line. Signals S51–S64 are generated at various points on the transmit signal path as indicated in graphs 3A–3K.

Microphone 41 is the first component included within the transmit signal path. Microphone 41 receives sound waves 42, and in response thereto, generates electronic signals S51 on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frquency $f_{s3}$ of approximately 22 kHz. Graph 3B and 3C illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, charge transfer device filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. Graph 3D illustrates the passbands of filter 700 when it is clocked to pass only the lower sideband. The 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. Graph 3E and 3F illustrate signals S56 and S57 in the frequency domain. As therein illustrated, signal S56 includes a plurality of filtered frequency bands; whereas, signal S57 includes only that band which is nearest to 455 KHz.

TABLE V

| $f_{s2}$ | MODE |
|---|---|
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mhz frequency, and it is generated as described supra. Mixer 5500 has an output coupled to a lead 5501, and signals S58 are generated thereon. Signals S58 equal signals S57 frequency shifted to 3.58 mHz ±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. Graph 3I illustrates signals S59 in the frequency domain.

Lead 5601 couples to the input of a mixer 5700. Mixer 5700 has a clocking input which couples to lead 202 for receiving signals S202. Signals S202 are generated as previously described, and contain the first selectable frequency $f_{s1}$. Frequency $f_{s1}$ is selectively chosen such that the sum of $f_{s1}$ +3.125 mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1}$ ±3.125 mHz as indicated in FIG. 14J.

An amplifier 5800 is coupled to receive signal S60, and to tune out the lower band of frequencies. Graph 3K illustrates the frequency spectrum of signal S61.

Figure 4A:
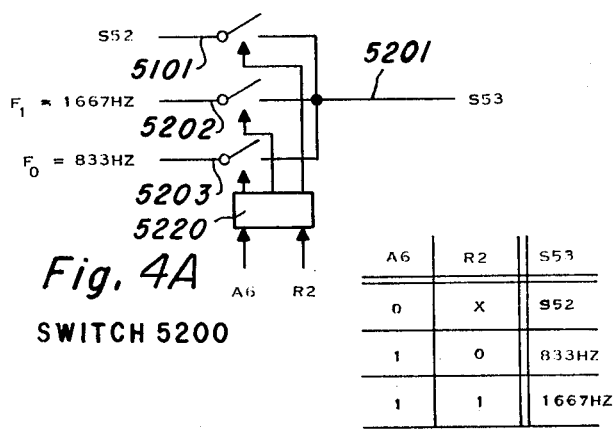

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in graph 3K. FIG. 4A is a functional schematic of switch 5200. Switch 5200 has three signal inputs coupled to leads 5101, 5202 and 5203 for receiving signals S52, $f_0$, and $f_1$, respectively. A logic enabling network 5220 is provided for receiving signals A6 and R2. Signals A6 and R2 logically pass one of the three input signals through switch 5200. FIG. 4A includes a truth table indicating this logical operation.

A detail circuit diagram of balanced modulator 5300 is illustrated in FIG. 15C. Basically, modulator 5300 is comprised of a sampling circuit 5310, and a carrier inserting circuit 5340. Sampling circuit 5310 includes an operational amplifier 5311 having a negative input coupled to receive signals S53 through a 100K resistor, and a positive input coupled to receive signals S53 through a 10K resistor. A logically controlled switch 5312 is provided to couple the positive input of amplifier 5311 to ground in response to signal S902. Thus, amplifier 5311 samples signals S53 at the frequency $f_{s3}$. A feedback circuit 5313 is provided for amplifier 5311 which includes a capacitor 5314 for smoothing the sharp voltage transitions which are generated at the output of the amplifier 5311 due to the sampling operation.

Figure 4B:
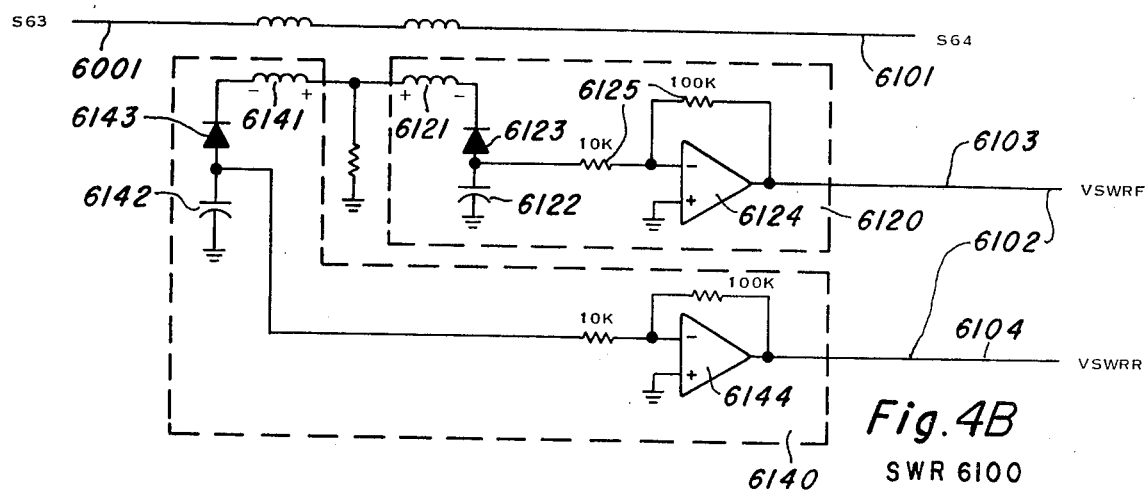

Signal S63 is inductively coupled via lead 6001 to the standing wave ratio measuring circuit 6100, as illustrated in FIG. 4B. Standing wave ratio circuit 6100 is comprised of a forward wave-measuring circuit 6120 and a reverse wave-measuring circuit 6140. Circuit 6120 includes an inductor 6121 which is serially coupled to a capacitor 6122 through a diode 6123. Signal S63 induces voltages across inductor 6121. Diode 6123 enables the induced voltage to generate a current through capacitor 6122 only when the inducted voltage is in response to a forward wave on lead 6001. Circuit 6120 further includes an operational amplifier 6124 having an input coupled to receive the voltage across capacitor 6122. Input and feedback resistors 6125 are provided to give operational amplifier 6124 a gain of approximately 10. The output of operational amplifier 6124 couples to a lead 6003, and signals VSWRF are generated thereon.

Circuit 6140 has a structure similar to that of circuit 6120. Circuit 6140 includes an inductor 6141, serially coupled to a capacitor 6142 through a diode 6143. A voltage is induced across inductor 6141 by signals S63, and diode 6143 permits current to flow through capacitor 6142 in response to the induced voltage whenever the induced voltage is due to a reflected wave within signal S63. An operational amplifier 6144 amplifies the voltage across capacitor 6142 by a factor of approximately 10 and generates output signals VSWRR on a lead 6004.

Figure 4C:
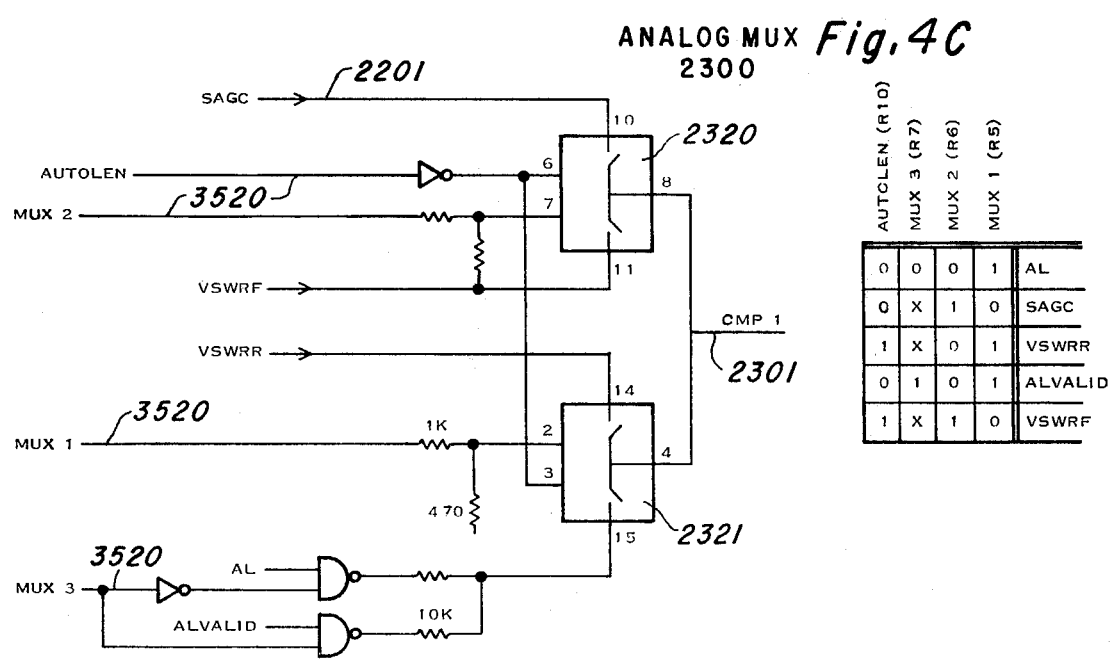

FIG. 4C is a detailed circuit diagram of analog multiplexer 2300. Multiplexer 2300 is comprised of two, logically controlled switches, 2320 and 2321. Logic signals MUX1, MUX2, MUX3, and AUTOLEN, which are generated by a microprocessor 3500 on leads 3520, are utilized to logically control switches 2320 and 2321. FIG. 4C includes a truth table which lists the input signal that is passed by multiplexer 2300 as a function of the logical control signals. Each of the input signals therein listed is described in the following portions of this description. An output signal CMP1 of multiplexer 2300 is generated on lead 2301.

FIG. 4D is a detailed circuit diagram of comparator 2400 and digital-to-analog converter 2500. Comparator 2400 includes an operational amplifier 2420. Amplifier 2420 has an input coupled to receive signal CMP1 through a 10-K resistor 2421, and the same input is coupled to receive signal CMP2 through a 51-K resistor 2422. Amplifier 2420 has a second input coupled to ground, and has no feedback circuitry. Therefore, its output, which couples to lead 2401, switches between a high and low voltage level dependent upon whether or not signal CMP1 is greater or less than signal CMP2.

Digital-to-analog converter 2500 is comprised of an operational amplifier 2520 having a resistive feedback network 2521 and a resistive input network 2522. Therefore, amplifier 2520 acts an a summer. Signals DA0–DA3 are selectively coupled to the input of resistors 2522 via leads 2502 to thereby provide a digitally-controllable input to the summer. Microprocessor 3500 operates to set the logical states of DA0–DA3 in response to signals L1 and L2 received from control unit 40. These signals are initiated by manual operaton of the control unit.

Signals VSWRF and VSWRR are coupled via leads 6003 and 6004 to analog multiplexer 2300, as was previously described in conjuction with FIG. 4C. Microprocessor 3500 selectively measures the voltage of signals VSWRF and VSWRR by means of digital-to-analog convertor 2500 and comparator 2400. Under normal operational conditions, signal VSWRF is much larger than signal VSWRR. Conversely, under abnormal conditions, signal VSWRR approaches or exceeds the magnitude of signal VSWRF. An abnormal condition may be the result of a damaged antenna 10, as an example. In the transmit mode, microprocessor 3500 intermittently transmits a 1667-Hz signal for short time intervals via a selective call unit 6300 (described infra) and measures the ratio of signals VSWRF and VSWRR by utilizing the above-described circuits. Microprocessor 3500 then indicates a failure condition to the operator if the standing wave ratio exceeds 4.0.

Figure 5:
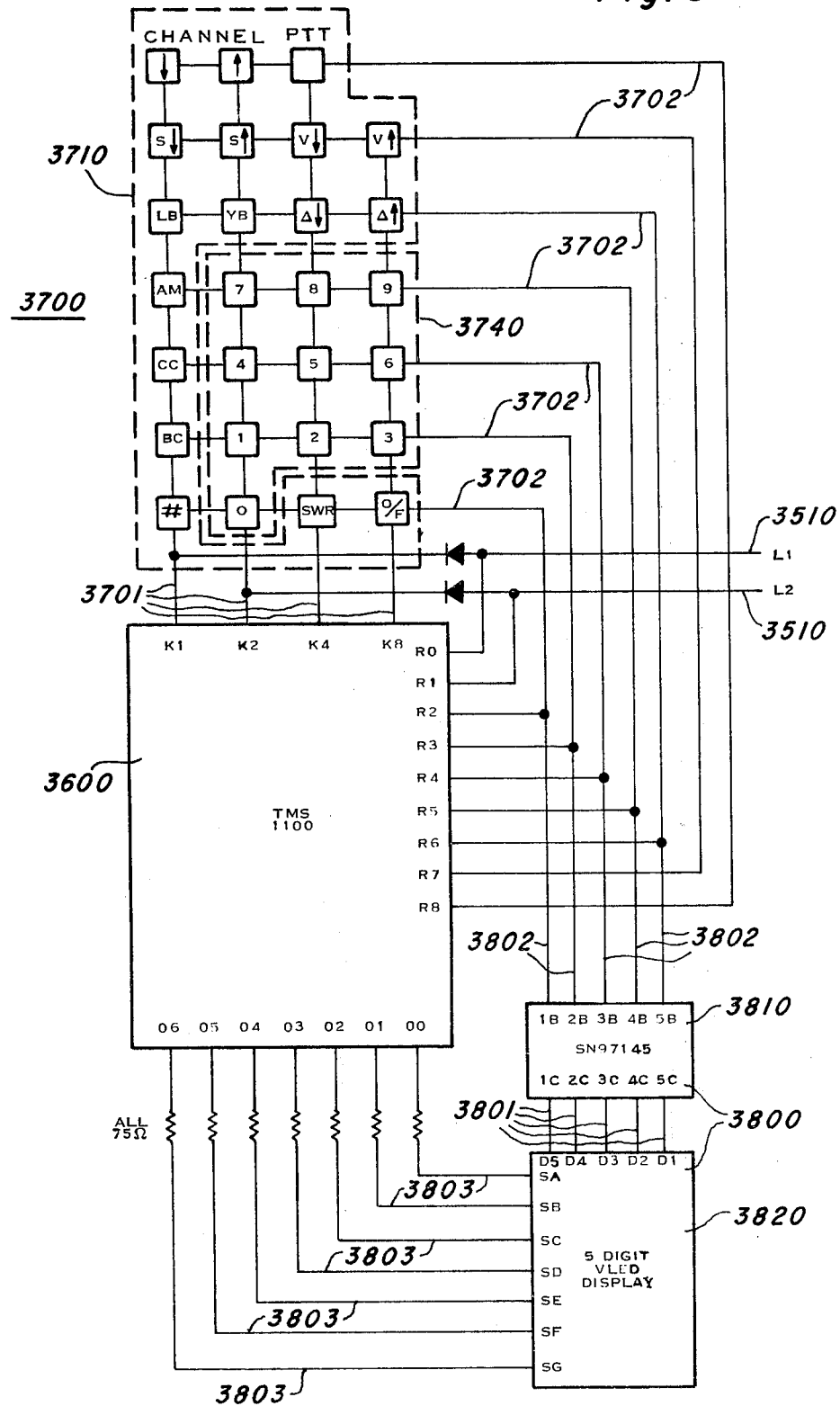
FIG. 5 is a detailed schematic diagram of the control unit included within FIGS. 1 and 2.

The means for manually operating the transceiver of FIGS. 1 and 2 will now be described in conjunction with FIG. 5. FIG. 5 is a detailed schematic diagram of keyboard 3700, display 3800, and microprocessor 3600, all of which are included within control head 40. In general, each operation which the transceiver performs is initiated via keyboard 3700.

Keyboard 3700 includes a plurality of control keys 3710 and a plurality of digit keys 3740. Control keys 3710 include a C ↑ key and a C ↓ key for incrementing the channel up or down respectively. Also, an S ↑ key and an S ↓ key is provided for modifying the squelch setting upward or downward respectively. Similarly, a V ↑ key and a V ↓ key is provided for turning the volume up or down, respectively. And a Δ↑ key and a Δ↓ key are provided for moving the clarifying frequency (i.e., $f_{s2}$) up or down respectively while receiving sideband signals.

Keyboard 3700 further includes keys LB, UB, and AM for selecting lower sideband, upper sideband or AM mode of operation, respectively. Also a CC key is provided for enabling the clear channel function, while a BC key is provided for enabling the busy channel function. A # key is provided for assigning a call number to the transceiver, and for enabling the transceiver to transmit a call number. A SWR key is provided for reading out the standing wave ratio. An O/F key is provided for enabling or disenabling the transceiver. And a PTT key (push to talk) is provided for enabling the transmit mode of operation.

Additionally, digit keys 3740 are provided for use in conjunction with various of the above-described control keys. For example, digit keys 2740 are used in conjunction with the LB key, UB key, and AM key for selecting a channel and mode of operation simultaneously. The actual sequence in which keys 3740 and keys 3710 are used to activate the various functions is listed in TABLE VI which will be described shortly.

Keyboard 3700 couples via leads 3701 and 3702 to microprocessor 3600 and is sensed thereby. Leads 3701 couple to the K register inputs of processor 2600, whereas leads 3702 couple to the R register outputs of microprocessor 3600. Thus, the state of any key within keyboard 3700 is sensed by microprocessor 3600 by selectively setting bits in register R, and by sensing for a return signal in register K.

Display 3800 also couples to microprocessor 3600 and is controlled thereby. Display 3800 is comprised of a 5-digit LED display 3820 and a digit driver circuit 3810. Leads 3801 couple the output of driver circuit 3810 to the digit inputs of display 3820; while leads 3802 couple the input to driver circuit 3810 to the output of register R of microprocessor 3600. The output of register O of microprocessor 3600 is coupled via leads 3803 to the segment inputs of LED display 3820. Thus, the state of the 5-digit display 3820 is controlled by microprocessor 3600 via its register R and O.

Microprocessor 3600 is further coupled via lead 3510 to microprocessor 3500. Leads 3510 provide the means whereby messages are sent between microprocessors 3500 and 3600.

When the operator wishes to transmit on his selected channel, he simply pushes the PTT key on keyboard 3,700. As a result, processor 3,600 sends a message to the slave processor 3,500 via leads 3,510. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667HZ is first transmitted for a period of several milliseconds. During this time interval, microprocessor 3,500 monitors the magnitude of the forward travelling waves and the reverse travelling waves on antenna 10. This is accomplished by selecting the SWR output by microcommand via analog multiplexer 2,300, and by monitoring the magnitude of the selected signals via leads 2,401.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Subsequently, the transmitting unit utilizes the selective call circuitry 6,300 to perform an autocall function (if the operator has so specified via keyboard 3,700). To this end, processor 3,500 generates microcommands which sequentially couple the 1 frequency and the 0 frequency of the selective call unit 6,300 to the transmit path via switch 5,200. Each bit comprising the selective call number is broadcast for only several milliseconds, and thus the entire operation is completed in a fraction of a second. Thus, the SWR monitoring function, the autolock function, and the selective call function are all easily performed between the time that the operator depresses a pushed PTT key and the time in which he begins to speak. After the last bit of the selective call message is transmitted, processor 3,500 generates the microcommand to switch 5,200 which couples signals S52 through the switch thereby enabling speech transmissions. Alternatively, if the operator has specified a digital control message for transmission, then processor 3500 will broadcast the bits of that message following transmission of the selective call number.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A radio transceiver having means for measuring the signal strength of its radio wave signal transmissions, said transceiver comprising:

TABLE VI

| SENSE STANDING WAVE RATIO KEY SEQ. = SWR L1, L2, MESSAGES: | | | | | | |
|---|---|---|---|---|---|---|
| 1-MASTER = E | C | φ | φ | φ | φ | C |
| 2-SLAVE = F | VSWR | VSWR | φ | φ | φ | C |
| 3-MASTER = C | φ | φ | φ | φ | φ | C |
| 4-SLAVE = C | channel number | channel number | Mode | signal strength | status | C |
| Steps 3 and 4 occur when key is released. | | | | | | |

(a) transducer means for converting audio information to be transmitted by said transceiver into audio electrical signals;

(b) frequency generator means for generating a reference frequency signal to be transmitted by said transceiver;

(c) a transmitter section having a signal input including an antenna means, said transmitter section for transmitting radio wave signals on said antenna means in accordance with signals applied to said signal input;

(d) electrically controllable switch means coupling said transducer means and said frequency generator means to said signal input, said switch means being controllable to alternately apply said reference frequency signal and said audio electrical signals to said transmitter section to be transmitted via said antenna means;

(e) standing wave sensing means coupled to said antenna means for generating first digital signals indicative of the magnitude of foward traveling voltage waveforms on said antenna means and for generating second digital signals indicative of the magnitude of reverse traveling voltage waveforms on said antenna means; and (f) digital processor means for controlling the operation of said transceiver, said digital processor means being coupled to said electrically controllable switch means for controlling said switch means to transmit a radio wave signal indicative of said reference frequency for a predetermined time period prior to transmission of radio wave signals containing audio information and being coupled to said standing wave sensing means for receiving said first and second digital signals and calculating signal strength based upon the first and second digital signals generating during the transmission of said reference frequency signal.

2. A transceiver according to claim 1, further including digital display means coupled to said digital processing means for digitally indicating the results of said signal strength calculations.

3. A transceiver according to claim 1, wherein said digital processing means is a microprocessor or a single semiconductor chip.

4. A radio transceiver according to claim 1, including a manually actuatable key switch means for enabling audio transmissions, said key switch means being coupled to said digital processor means for generating digital signals indicative of actuation of said key switch wherein said digital processor means generates an electrical signal controlling said switch means to couple said reference frequency signal to the signal input of said transmitter section for said predetermined time interval.

5. A radio transceiver according to claim 4 wherein said predetermined time interval is less than one second.

6. A transceiver according to claim 1, wherein said standing wave sensing means is comprised of a forward wave-measuring means having first inductor means inductively coupling said forward wave-measuring means to said antenna means, and reverse wave-measuring means having second inductor means inductively coupling said reverse wave-measuring means to said antenna means.

7. A transceiver according to claim 6, wherein said forward wave-measuring means is comprised of first charge storage means having an input coupled to said first inductor means by means of a first unidirectional conductive means, said first charge storage means for storing charge of a magntidue proportional to said forward traveling waveform, and said reverse wave-measuring means is comprised of second charge storage means having an input coupled to said second inductor means by means of a second unidirectional conductive means, said second charge storage means for storing charge of a magnitude proportional to said reverse traveling waveforms.

8. A transceiver according to claim 7 wherein said first and second charge storage means are capacitors.

9. A transceiver according to claim 7 wherein said first and second unidirectional means are diodes.

10. A transceiver according to claim 7 including first and second operational amplifiers having predetermined gain respectively coupling said first and second charge storage means to said digital processor means.

11. A transceiver according to claim 10 including an analog multiplexer coupling said forward wave-measuring means and said reverse wave-measuring means alternately to said digital processor means.

12. A transceiver according to claim 11 including (a) comparator means having first and second inputs and an output, said first input coupled to said analog multiplexer, and said output coupled to an input of said digital processor means; and (b) a digital-to-analog converter means coupled to receive digital coded signals from said digit processor and converting such signals to analog signals, said analog converter means having an output means coupled to said second input of said comparator means, said digital processor means for comparing the magnitude of said forward traveling waveform with the magnitude of said reverse traveling waveform by means of said comparator means to determine the standing wave ratio therefrom.

13. A transceiver according to claim 12 wherein said digital processor means generates a failure condition when the computed standing wave ratio exceeds a predetermined amount.

* * * * *